(12) United States Patent
Frank et al.

(10) Patent No.: US 7,119,671 B2
(45) Date of Patent: Oct. 10, 2006

(54) SEAT BUCKLE SENSOR

(75) Inventors: Ronald Frank, Stoughton, MA (US); Matthew De Remer, Brighton, MA (US); Adam Young, Randolph, MA (US)

(73) Assignee: Stoneridge Control Devices, Inc., Canton, MA (US)

( * ) Notice: Subject to any disclaimer, the term of this patent is extended or adjusted under 35 U.S.C. 154(b) by 70 days.

(21) Appl. No.: 10/761,129

(22) Filed: Jan. 20, 2004

(65) Prior Publication Data

US 2004/0227638 A1    Nov. 18, 2004

Related U.S. Application Data

(60) Provisional application No. 60/441,078, filed on Jan. 17, 2003.

(51) Int. Cl.
*B60Q 1/00* (2006.01)
(52) U.S. Cl. ............... 340/457.1; 340/686.4; 324/207.13
(58) Field of Classification Search .......... 340/457.1, 340/687, 686.4, 686.6, 693.12, 693.5, 551; 24/633; 280/801.1
See application file for complete search history.

(56) References Cited

U.S. PATENT DOCUMENTS

| | | | | |
|---|---|---|---|---|
| 4,124,814 A | * | 11/1978 | Lauerman | 324/207.2 |
| 4,943,087 A | * | 7/1990 | Sasaki | 280/804 |
| 5,594,335 A | * | 1/1997 | Melbert | 324/207.2 |
| 6,053,529 A | * | 4/2000 | Frusti et al. | 280/735 |
| 6,184,785 B1 | * | 2/2001 | Midorikawa | 340/457.1 |
| 6,278,347 B1 | * | 8/2001 | Hofelsauer | 335/205 |
| 6,329,893 B1 | * | 12/2001 | Furukawa et al. | 335/205 |
| 6,381,815 B1 | * | 5/2002 | Yamaguchi et al. | 24/633 |
| 6,729,427 B1 | * | 5/2004 | Do | 180/268 |

FOREIGN PATENT DOCUMENTS

| | | | | |
|---|---|---|---|---|
| GB | 2385630 A | * | 8/2003 | |
| JP | 2001-224408 | * | 8/2001 | |
| JP | 2003-265206 | | 9/2003 | |

OTHER PUBLICATIONS

PCT International Search Report received in corresponding PCT Application No. PCT/US04/01424, mailed on Jul. 7, 2005.
PCT Written Opinion received in corresponding PCT Application No. PCT/US04/01424, mailed on Jul. 7, 2005.

* cited by examiner

*Primary Examiner*—Benjamin C. Lee
*Assistant Examiner*—Sihong Huang
(74) *Attorney, Agent, or Firm*—Grossman, Tucker, Perreault & Pfleger, PLLC

(57) ABSTRACT

A seat buckle sensor system is provided that provides an output representative of a lock condition of a seat belt buckle. The system includes a magnet on an end of a seat buckle lock pin and a Hall device. The lock pin, and magnet on the end thereof, move between a locked position and an unlocked position relative to the Hall device. The magnet imparts a first magnetic flux on the Hall device in the locked position causing the Hall device to produce a first output. The magnet imparts a second magnetic flux on the Hall device in the unlocked position causing the Hall device to produce a second output.

19 Claims, 15 Drawing Sheets

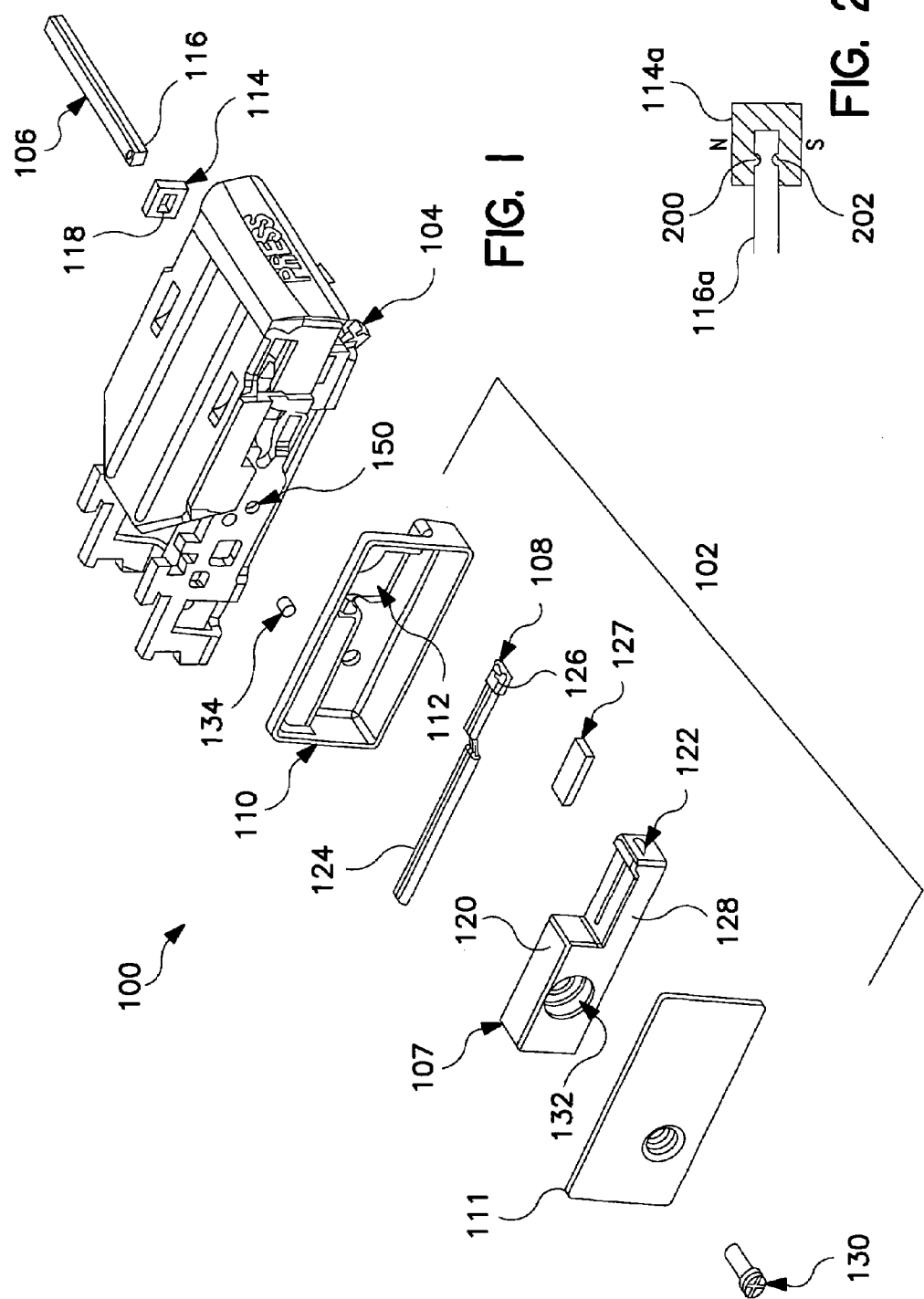

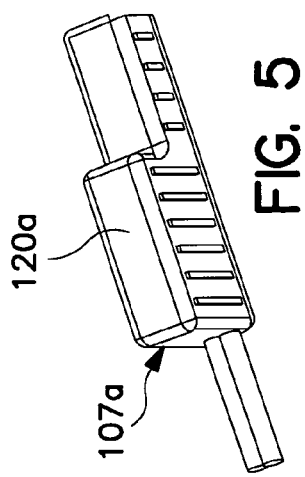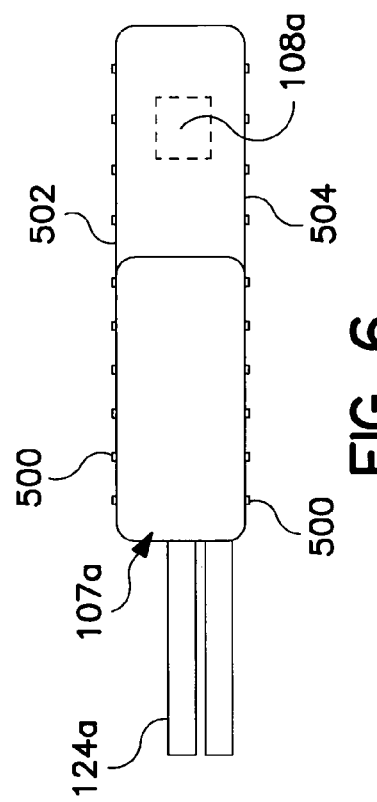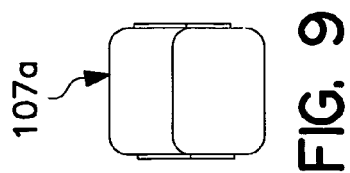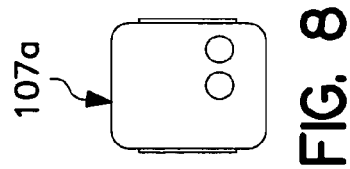

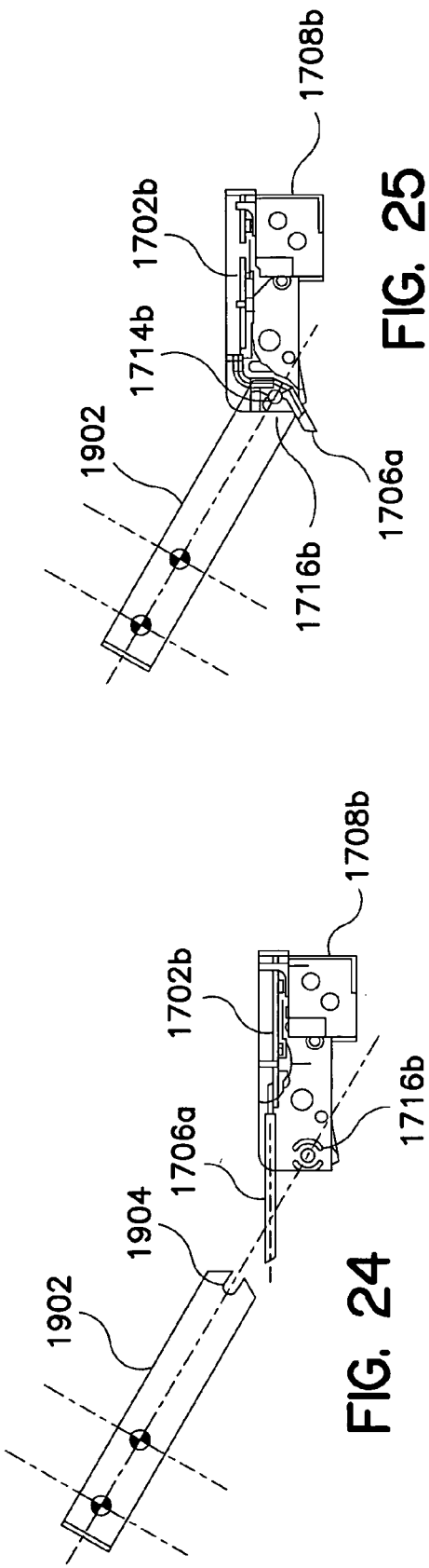
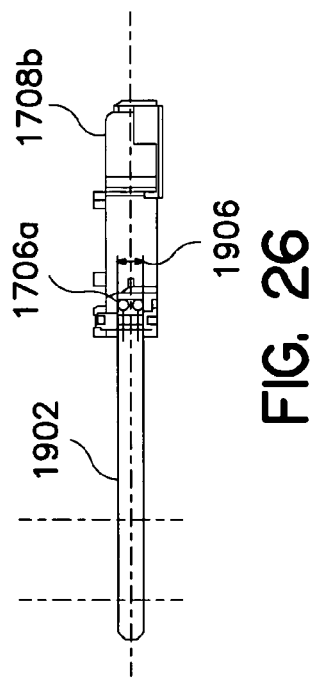

SEAT BUCKLE SENSOR

CROSS-REFERENCE TO RELATED APPLICATIONS

The present application claims the benefit of U.S. Provisional Application Ser. No. 60/441,078, filed on Jan. 17, 2003, the entire disclosure of which is incorporated herein by reference.

FIELD OF THE INVENTION

The present invention relates in general to sensors, and, more particularly, to a sensor for sensing the condition of a seat belt buckle in a vehicle.

BACKGROUND OF THE INVENTION

Seat belt buckle sensors are used in vehicle systems for a variety of purposes, such as for providing a safety warning to the vehicle occupants, and setting an air bag system at a proper deployment force associated with a particular seat occupant. Seat belt buckle sensors generally provide an output indicating whether the buckle tongue attached to the seat belt webbing is engaged with the seat belt buckle in a locked condition. This output may be combined with information from other sensors, e.g. a seat belt tension sensor, a weight sensor and/or seat position sensor, to determine whether and to what extent an air bag should be deployed in the event of an accident.

There is a need, however, for a seat buckle sensor that provides accurate and reliable sensing of the buckle condition, while allowing cost-effective manufacture an installation.

BRIEF DESCRIPTION OF THE DRAWING

For a better understanding of the present invention, together with other objects, features and advantages, reference should be made to the following detailed description which should be read in conjunction with the following figures wherein like numerals represent like parts:

FIG. 1: is an exploded perspective view of a seat belt buckle assembly including a seat buckle sensor consistent with the invention;

FIG. 2: is a sectional view of the end of a lock pin and magnet assembly useful in connection with a sensor consistent with the invention;

FIG. 5: is a perspective view of an exemplary sensor housing useful in connection with a sensor consistent with the invention;

FIG. 6: is a top view of the sensor housing illustrated in FIG. 5;

FIG. 7: is a side view of the sensor housing illustrated in FIG. 5;

FIG. 8: is a first end view of the sensor housing illustrated in FIG. 5;

FIG. 9: is a second end view of the sensor housing illustrated in FIG. 5;

FIGS. 24–26: illustrate a second exemplary method for dressing PCB leads in a labyrinth wire strain relief configuration consistent with the present invention;

DETAILED DESCRIPTION

Figure 4:
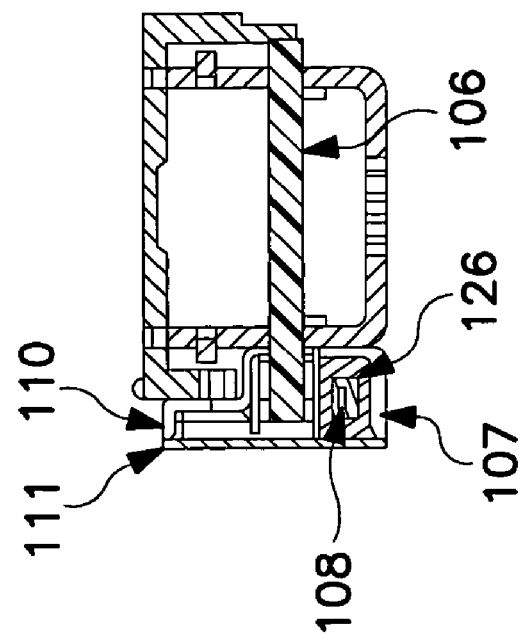
FIG. 4: is a sectional view of the assembly illustrated in FIG. 3, taken along lines 4—4.

For ease of explanation, the sensor systems consistent with the invention may be described herein in connection with automobile seat belt systems. It will be recognized, however, a seat belt buckle sensor consistent with the invention will be useful in connection with a wide variety of vehicle types. In addition, the exemplary embodiments described herein include the use of Hall Effect sensors and a magnet. Those skilled in the art will recognize, however, that a variety of sensing means may be used. For example, optical, magneto-resistive, fluxgate sensors, etc. may be useful in connection with a sensor system consistent with the invention. In alternative embodiments sensor control elements other than magnets or shunts, e.g. an optical source, may be used. It is to be understood, therefore, that illustrated exemplary embodiments described herein are provided only by way of illustration, and are not intended to be limiting.

Turning to FIG. 1, there is illustrated, in exploded perspective view, one exemplary seat belt buckle assembly 100 including an exemplary seat buckle sensor 102 consistent with the invention. In the illustrated embodiment, the assembly includes a seat belt buckle 104 and a seat buckle sensor 102. The buckle 104 may be of conventional design for receiving a buckle tongue attached to seat belt webbing. The buckle 104 may include a lock pin 106 that moves within the buckle 104 between an unlocked position, wherein the tongue is freed to enter or exit the buckle 104, and a locked position, wherein the tongue is secured within the buckle 104.

The sensor 102 may be affixed to a side of the buckle, and provide an output representative of the lock state of the lock pin 106 in the buckle. The sensor 102 may generally include a sensor housing 107 in which a Hall Effect sensor device 108 is disposed, and a magnetic shield including a housing 110 and a cover 111 for shielding external magnetic sources, e.g. a speaker magnet, from the sensor housing 107.

The magnetic shield housing 110 may include an opening 112 in a side thereof for receiving the end of the lock pin 106 through its range of movement between locked and unlocked states. In the illustrated embodiment, a magnet 114 is provided on the end 116 of the lock pin that extends into through the opening 112 in the shield. As shown, the magnet may be generally square with a square central opening 118 for receiving the end of the lock pin 116 in a press fit manner. Alternatively and as shown in the FIG. 2, the magnet 114a may be molded onto the end of the lock pin. If the magnet 114a is molded onto the lock pin, the end of the lock pin may include indentations 200, 202 on the top and bottom thereof for receiving the magnet and resisting removal of the magnet from the pin, although such features are not required.

The sensor housing 107 may be generally rectangular in cross-section with a stepped top surface 120. The housing 107 may include an interior cavity 122 for receiving the Hall device 108 and leads 124 extending therefrom to, for example, the vehicle wire harness. A rubber sheet 127 may be provided in the housing to securely wedge the Hall device into a desired location. In an alternative embodiment, as shown for example in FIGS. 5–9, the sensor housing 107a may be formed by encapsulating the Hall device 108a and leads 124a in a molded plastic material. In the embodiment 107a, the sensor housing may also be generally rectangular in cross-section with a stepped top surface 120a. Crush ribs 500 may be provided on the sides 502, 504 of the housing, as shown.

Figure 3:
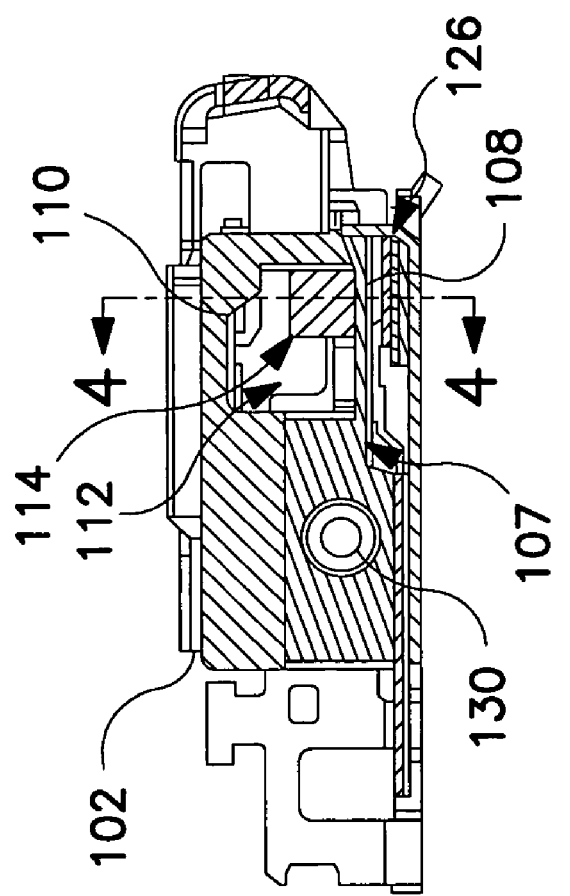
FIG. 3: is a sectional view of the assembly illustrated in FIG. 1.

As shown, for example, in FIG. 3, the face surface 126 of the Hall device may be positioned adjacent the upper surface 120 of the housing in the lower step portion 128 thereof The end of the lock pin 106 with the magnet 114 thereon may extend through the opening 112 in the shield housing 110 so that it is positioned above the upper surface 120 of the housing lower step portion 128. When the lock pin 106 is in an unlocked state, the magnet 114 and pin 106 are disposed away from the Hall device 108 in the upper left corner of the opening 112 illustrated in FIG. 3. The Hall device 108 may thus provide an output indicating that the buckle is unlocked or not engaged with a buckle tongue. However, when the tongue is inserted into the buckle, the pin 106 and magnet 114 may move to the position illustrated in FIGS. 3 and 4, whereby the magnet 114 is positioned directly above the Hall device 108. With the magnet 114 in this position, the Hall device 108 may provide an output indicating that the buckle is locked or engaged with a buckle tongue.

The sensor assembly 102 may be mounted to the buckle 104 by a screw 130 extending through the shield cover 111, an opening 132 in the sensor housing 107, the shield housing 110, and into a tapped thread 150 of the buckle 104. A non-ferrous dowel 134 may have one end press fit into the buckle 104 and another end press fit into the shield housing 110 to further secure the sensor 102 to the buckle 104. Those skilled in the art will recognize other means of securing the sensor 107 to the buckle 104.

Figure 10:
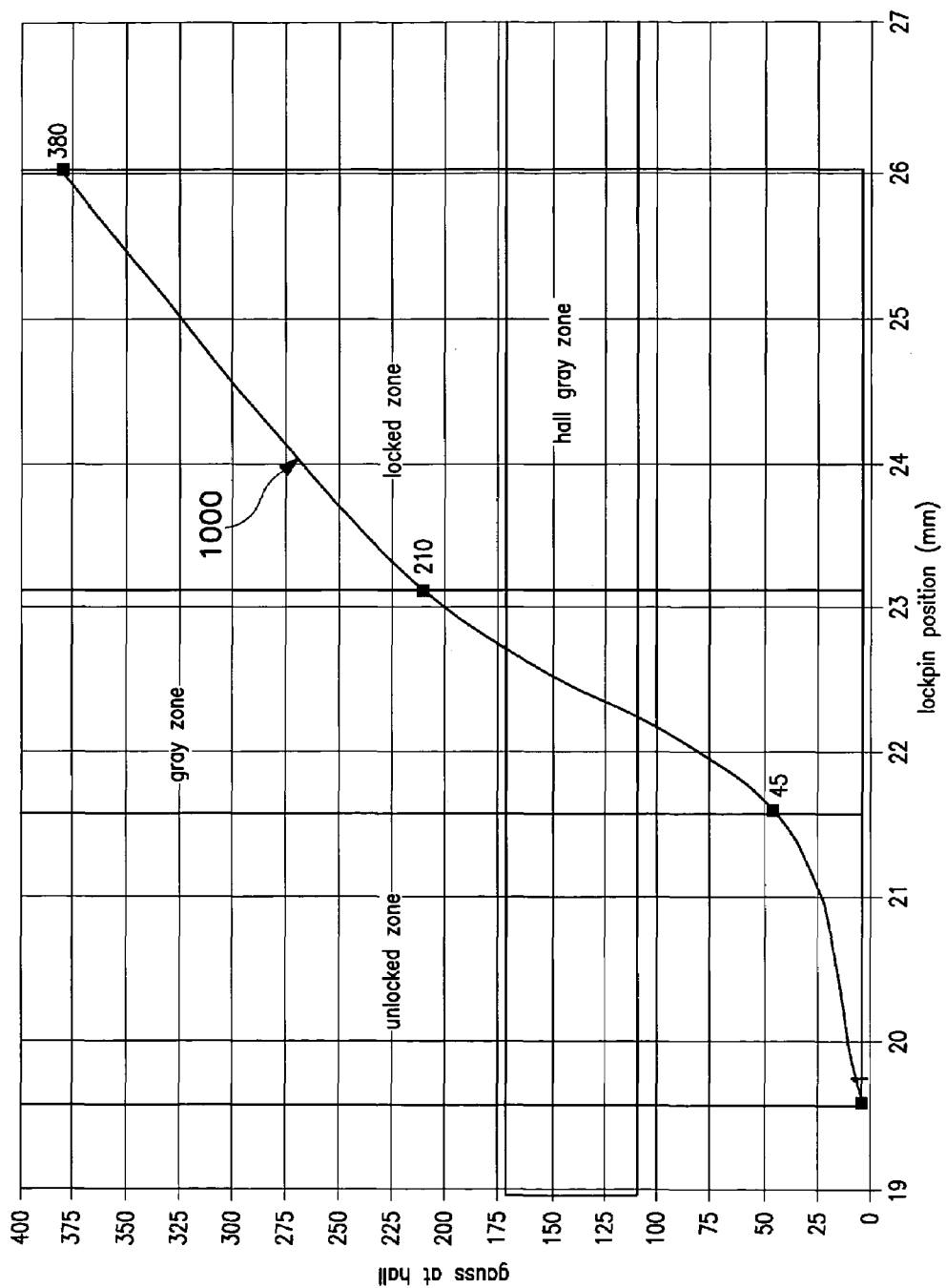
FIG. 10: is a plot of magnetic flux imparted to a Hall device vs. lock pin position in a sensor consistent with the invention.

FIG. 10 is a plot of 1000 magnetic flux imparted to a Hall device vs. lock pin position for a sensor consistent with the invention. As shown, a gradient of about 165 Gauss may be associated with movement of the pin 106 by about 1.5 mm between the locked and unlocked states. Providing the magnet 114 on the lock pin 106 advantageously provides excellent switch point tolerance for the Hall device. Also, the magnetic shield effectively prevents external magnetic fields generated by other mechanisms, e.g. speakers, from interrupting proper operation of the sensor.

Figure 11:
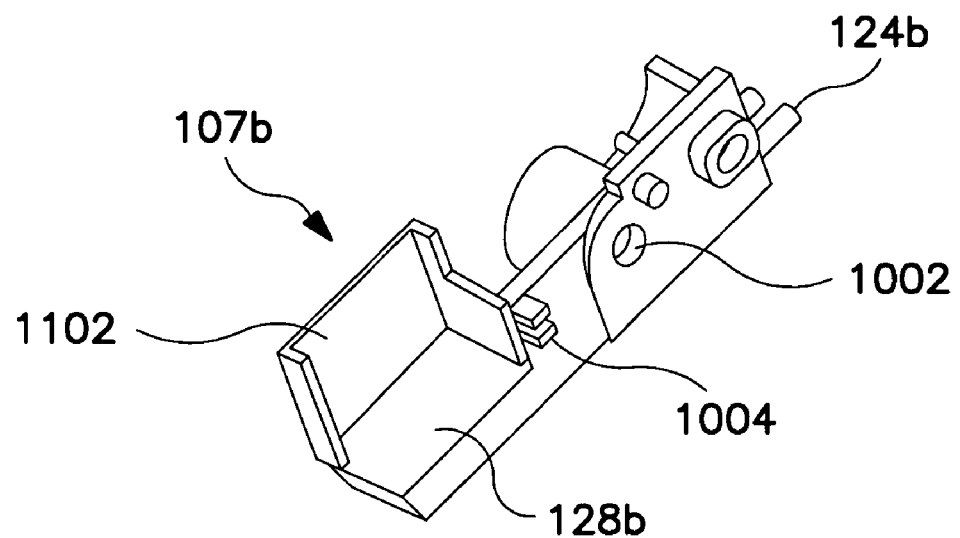
FIG. 11: is a top perspective view of an alternative sensor housing consistent with the, invention.
Figure 12:
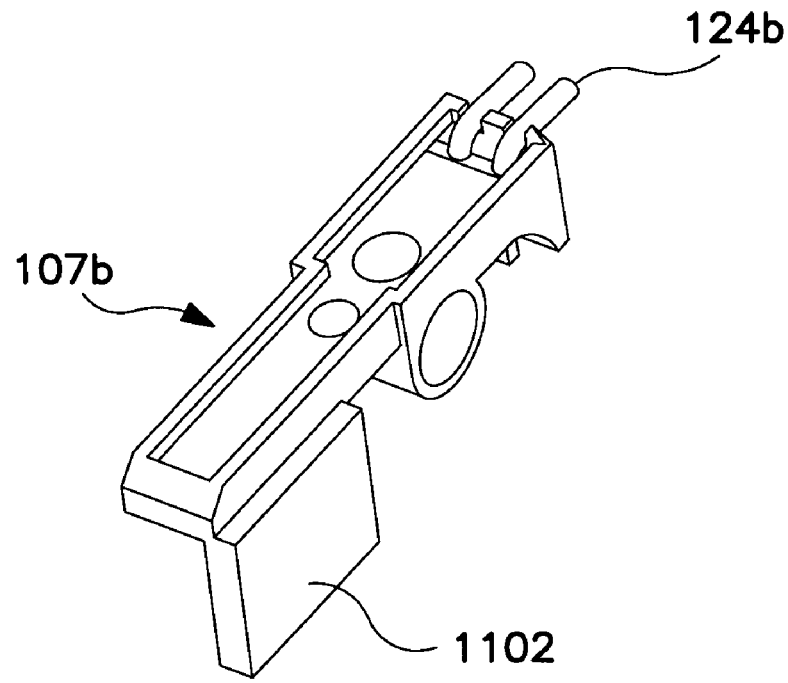
FIG. 12: is a bottom perspective view of the alternative sensor housing of FIG. 11.

Referring to FIGS. 11 through 16 two alternative exemplary magnetic shielding arrangements are shown. FIGS. 11 and 12 show a top and bottom perspective of an exemplary sensor housing 107b containing a Hall device (not shown) with electrical connections 124b extending therefrom. The sensor housing 107b may include a step portion 128b, that may provide a sensing region. The housing 107b may also include an upstanding wall 1102 extending from the step portion 128b of the housing. The housing 107b may also include various holes 1002, bosses 1004, etc. that may provide mounting points for the sensor, etc.

Figure 13:
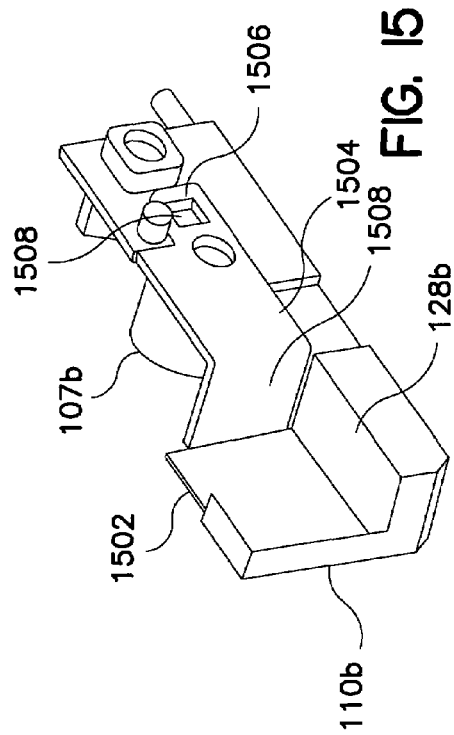
FIG. 13: is a top perspective view of the sensor housing of FIG. 11 assembled to an exemplary shield consistent with the invention.
Figure 14:
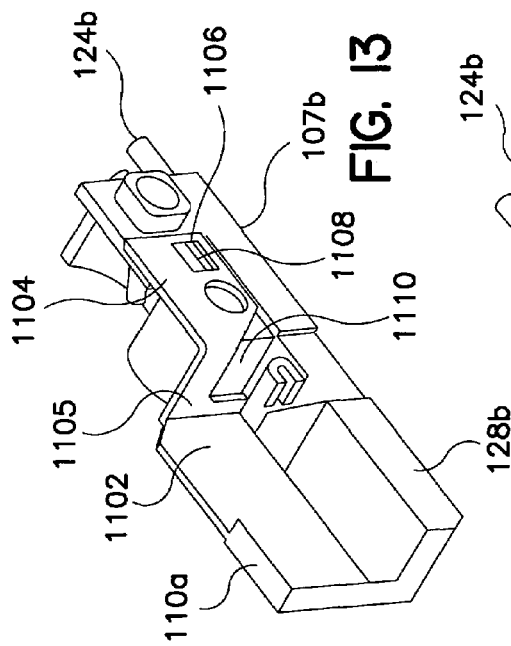
FIG. 14: is a bottom perspective view of the assembly of FIG. 13.

Turning to FIGS. 13 and 14 a top and bottom perspective view of a first alternative magnetic shielding arrangement is shown. In the first arrangement, the shield 110a may be a one-piece, steel stamping. Those having skill in the art will appreciate that materials other than steel may advantageously be employed to provide magnetic shielding. Most clearly illustrated in FIG. 14, the shield 110a may extend around the bottom of the sensor housing 107b, partially enclosing the step portion 128b and Hall device therein, and up the backside of the upstanding wall 1102. The shield 110a may also include a latching wall 1104 extending along a portion of the sensor housing 107 to the rear of the step 128b. As shown, the latching wall 1104 may include an opening 1106 for receiving a snap detent 1108 on the housing 107b, allowing the shield 110a to be snapped to the housing 107b without requiring secondary attachment processes. Those having skill in the art will appreciate that other snap-fit type assemblies may also suitably be employed.

The shield 110a illustrated in FIGS. 13 and 14 may include a cut-out region 1110 located on a wall portion 1105 extending generally between the upstanding wall and the latching wall 1104. The cut-out region 1110 may allow the sensor housing 107b to be at least partially loaded into the shielding at an angle, and then rotated relative to the housing 107b. Rotating the housing 107b relative to the shield 110a may bring the housing 107b and shield 110a into alignment and engage the snap detent 1108 with the opening 1106.

Figure 15:
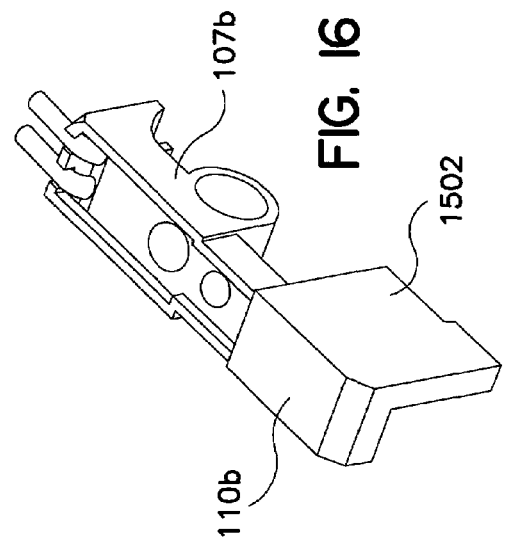
FIG. 15: is a top perspective view of the sensor housing of FIG. 11 assembled to another exemplary shield consistent with the invention.
Figure 16:
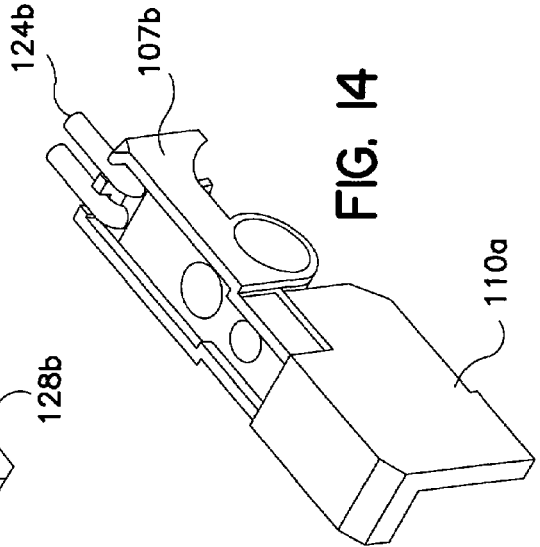
FIG. 16: is a bottom perspective view of the assembly of FIG. 15

Turning to FIGS. 15 and 16 another alternative shielding arrangement is shown. Consistent with this embodiment, the shield 110b may also be a stamped member and may be configured in the same general manner as the previous embodiment, including an upstanding wall 1502, a latching wall 1504 extending along a front side of the housing 107b and including an opening 1506 for receiving the snap detent 1108. As with the preceding embodiment, the shield 110b may at least partially enclose the step portion 128b of the housing 107b. The shield 110b may include a transverse wall 1508 extending between the upstanding wall 1502 and the latching wall 1504. The transverse wall 1508 may be formed without a cut-out. The housing 107b may be assembled to the shield 110b in a sliding manner. That is, the step portion 128b of the housing 107b may be axially inserted into the corresponding region of the shield 110b. The housing 107b may then be slid axially relative to the shield 110b until the detent 1108 engages the opening 1506.

Figure 17:
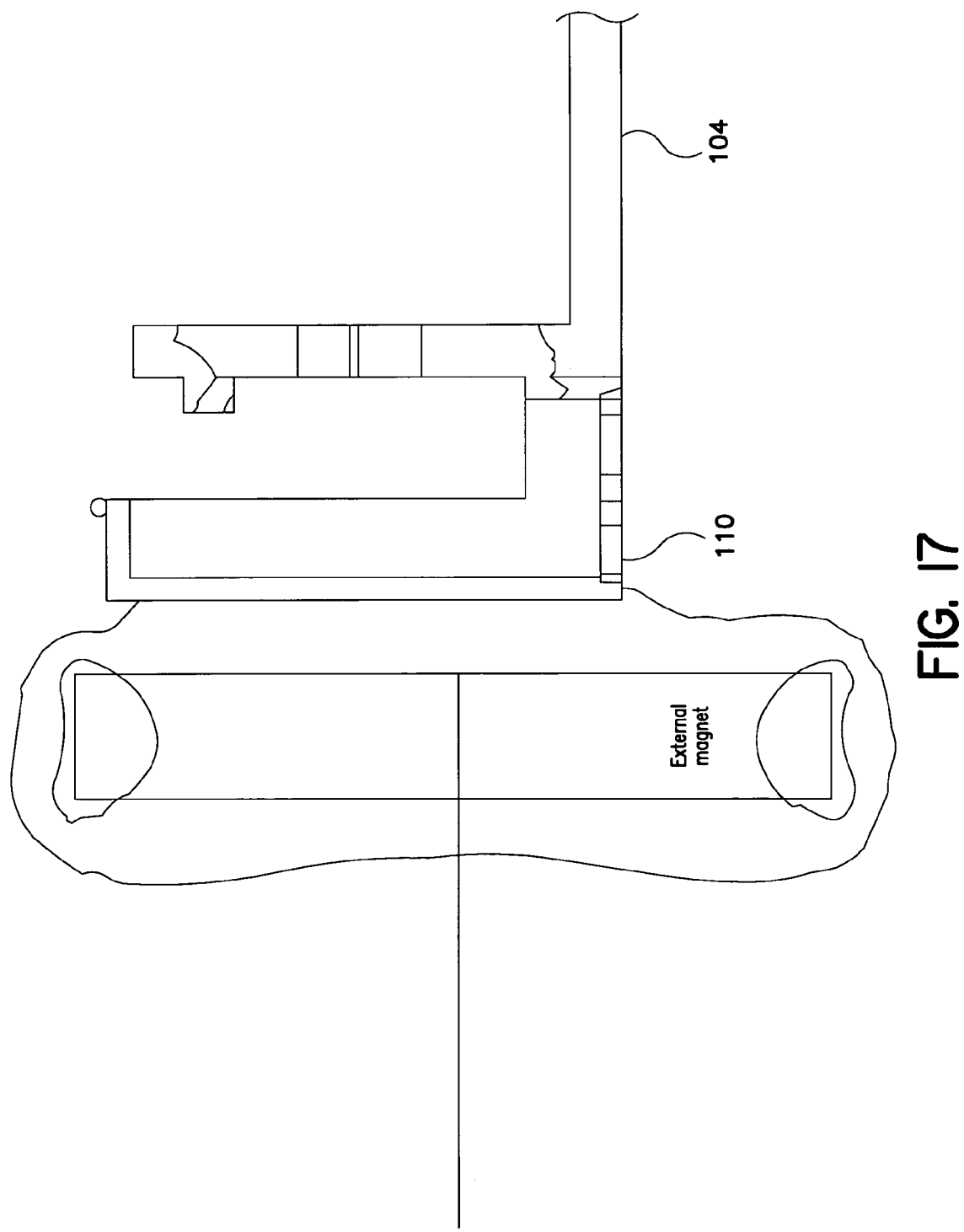
FIG. 17: is a magnetic flux plot showing the sinking effect of providing shielding consistent with the invention.

FIG. 17 is a plot of magnetic flux generated by an external magnet 1700 around a sensor consistent with the invention. As shown, the shield 110, 110a, or 110b may be designed to mate closely with the buckle 104 to allow sinking of interference magnetic flux from the shield to buckle 104. That is, external magnetic flux imparted on the shield may at least partially flow through the shield and into the buckle 104. In this way, external magnetic flux imparted on the Hall device may be reduced. The frame of the buckle 104 may generally be thicker than the shield 110, 110a, or 110b, and therefore better able to disperse the errant fields. Sinking of external magnetic flux flow in this manner may make it possible to use a weaker magnet 114, e.g., plastic bonded, which can be molded directly to the locking pin 106.

In addition to providing shielding against external magnetic flux, the shield 110, 110a, or 110b may act as a retainer for the lock pin 106. That is, the upstanding portion of the shield may prevent the lock pin 106 from traveling axially, and therein prevent the lock pin from causing the buckle mechanism to jam.

Figure 19:
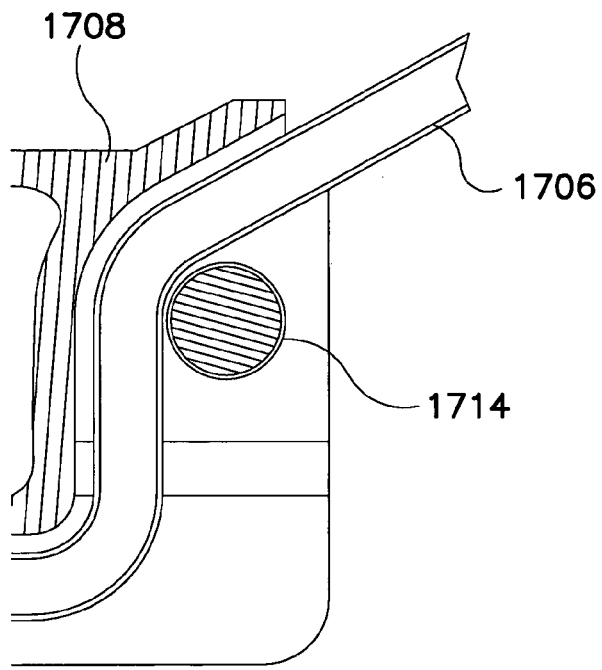
FIG. 19: is a detailed illustration of a labyrinth wire strain relief aspect of the assembly shown in FIG. 18.
Figure 18:
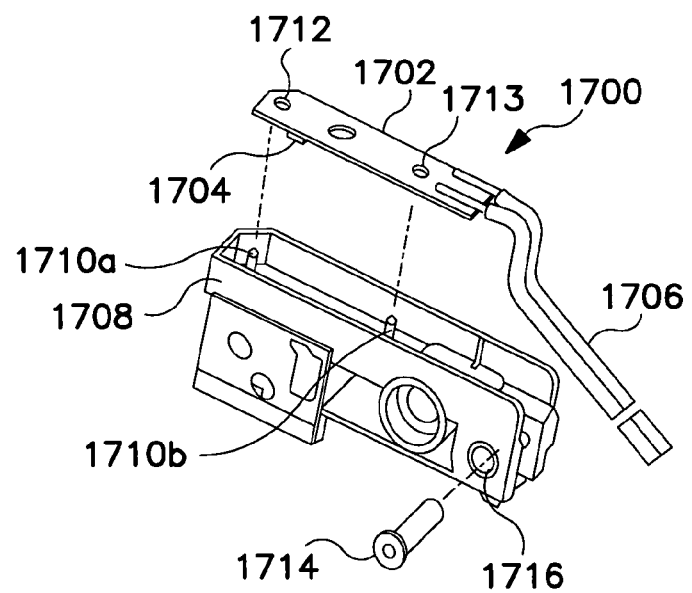
FIG. 18: is an exploded perspective view of another exemplary sensor assembly consistent with the invention.
Figure 20:
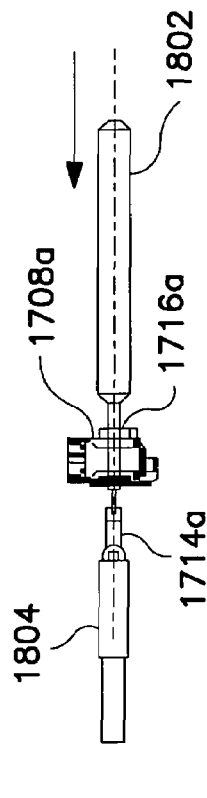
FIGS. 20–23: show a first exemplary method for dressing PCB leads in a labyrinth wire strain relief configuration consistent with the present invention.

Turning next to FIGS. 18 and 19, an alternative sensor assembly 1700 is shown. The assembly 1700 may include a printed circuit board (PCB) 1702, which may contain a Hall device 1704. The PCB 1702 may also include leads 1706 extending therefrom. The PCB 1702 may be loaded on the housing 1708, receiving locating pins 1710a-b through corresponding holes 1712, 1713 in the PCB 1702. A labyrinth strain relief may be provided by shaping the leads 1706 generally into an "s" configuration.

As shown in greater detail in FIG. 19, the PCB 1702 may be loaded on the housing 1708 and a pin, screw, etc., 1714 may be disposed through a hole 1716 in the housing 1708 thereby holding the leads 1706 in the general "s" configuration between the pin 1714 and the housing 1708. The labyrinth strain relief configuration may cause leads 1706 to bind on the pin 1714 and/or housing 1708 when a stress is applied to the leads 1706. This arrangement may reduce any strain on the solder joints between the leads 1706 and PCB 1702, and/or reduce any loads applied to the PCB 1702 itself.

Figure 21:
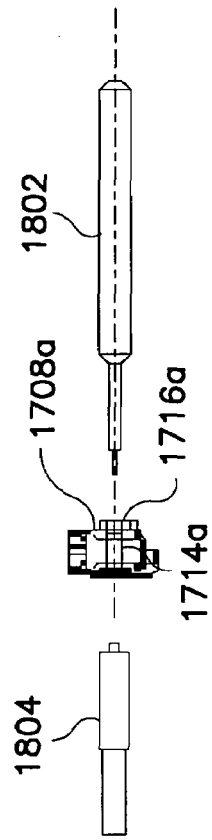

Referring to FIGS. 20–23, a first method for dressing the leads from the PCB to produce a labyrinth wire strain relief configuration is shown. According to the first method, an alignment tool 1802 and installation tool 1804 are used to install a screw, rivet, pin etc., 1714a to dress the leads in a labyrinth strain relief configuration, consistent with preceding disclosure. As shown in FIG. 21, the alignment tool may be passed through a hole 1716a in the housing 1708a to maintain the leads in the desired "s" configuration. The alignment tool 1802 may extend through the housing 1708a and be received in an-opening or indentation in the end of the pin 1714a disposed on the end of the installation tool 1804, thereby aligning the pin 1714a with the hole 1716a.

Figure 22:
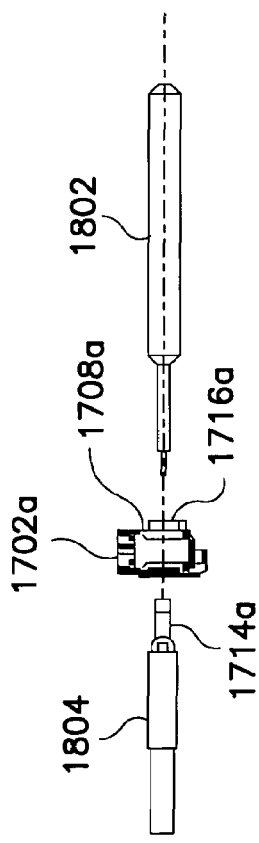
Figure 23:
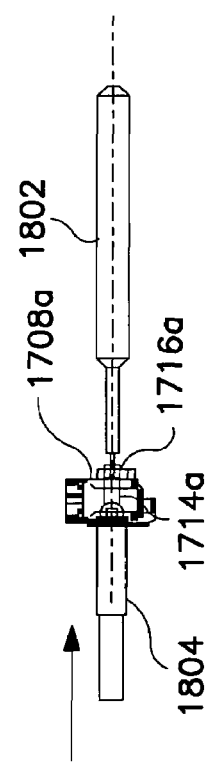

As shown in FIGS. 22 and 23, the installation tool 1804, pin 1714a and alignment tool 1802 may travel together to insert the pin 1714a though the hole 1716a with the alignment tool 1802 providing the desired alignment of the pin 1714a. Once the pin 1714a is installed in the housing 1708a, the alignment tool 1802 and installation tool 1804 may be retracted away from the housing 1708a. This method may facilitate cost effective automated assembly of the sensor.

FIGS. 24 through 26 illustrate a second exemplary method for dressing the leads from the PCB in a labyrinth strain relief configuration. This second method utilizes a whale mouth tool 1902 to dress the leads 1706a and maintain the leads 1706a in the desired configuration while a screw, pin, rivet, etc. 1714b is installed in the housing 1708b. Referring to FIG. 24, the whale mouth tool 1902 may be aligned with the housing 1708b and leads 1706a. The whale mouth tool 1902 may then travel toward the housing 1708b and engage the leads 1706a, causing the leads to bend into the desired configuration, as shown in FIG. 25.

The whale mouth tool 1902 includes a "mouth" or indentation 1904 on the working end thereof. While the whale mouth tool 1902 maintains the leads 1706b in the desired configuration relative to the housing 1708b, the mouth 1904 of the tool 1902 allows a pin 1714b to be inserted through the hole 1716b in the housing 1708b. After the pin 1714b is installed in the housing 1708b, the whale mouth tool 1902 may, optionally, be withdrawn from the housing 1708b and leads 1706b. In the top view of FIG. 26, wherein the housing is 1708b is shown with the whale mouth tool 1902 engaged with the leads 1706a, it can be seen that the tool 1902 may be provided having a width generally equal to the nominal housing cavity width 1906.

Those having skill in the art will appreciate that the preceding methods for dressing the leads may be combined. Consistent with the embodiment described with reference to FIGS. 24 through 26, the whale mouth tool 1902 may be used to bend the leads into the desired labyrinth configuration. Consistent with this method, the alignment tool and 1802 and installation tool 1804, described with reference to FIGS. 22 and 23, may be employed to insert a pin 1714 through the hole 1716. According to one embodiment combining these methods, it may be possible to assemble a sensor having a labyrinth lead configuration using an automated process.

Figure 27:
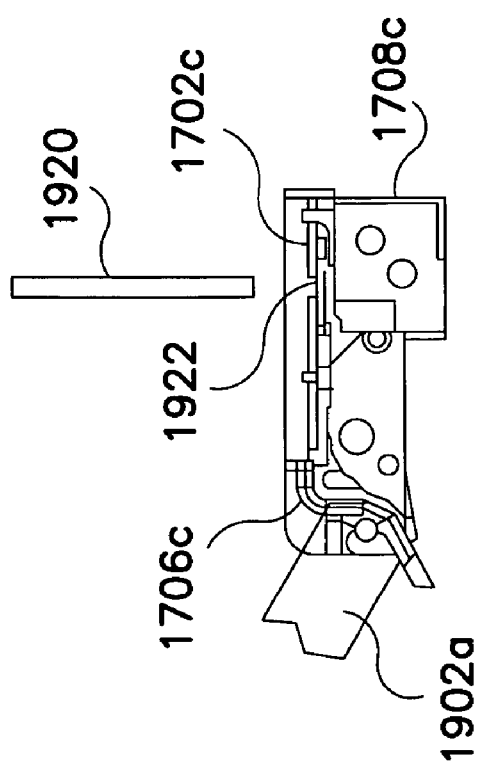
FIGS. 27–31: illustrate an exemplary potting injection process that may be used for producing a sensor consistent with the present invention.

Turning next to FIGS. 27 though 31, an exemplary potting injection process consistent with the present invention is shown. As used herein, potting refers to embedding and/or partially or fully encapsulating a component, e.g., a PCB, in a polymer resin. Consistent with a potting process the housing containing the PCB may be filled with a polymer resin which may be hardened, thereby integrating the housing, the PCB and the potting resin. Alternatively, the process may be an encapsulation process, wherein the PCB may be maintained in a mold having a desired housing geometry, the mold filled with resin, and then the PCB encapsulated in resin may be removed from the mold after the resin has at least partially hardened.

Figure 28:
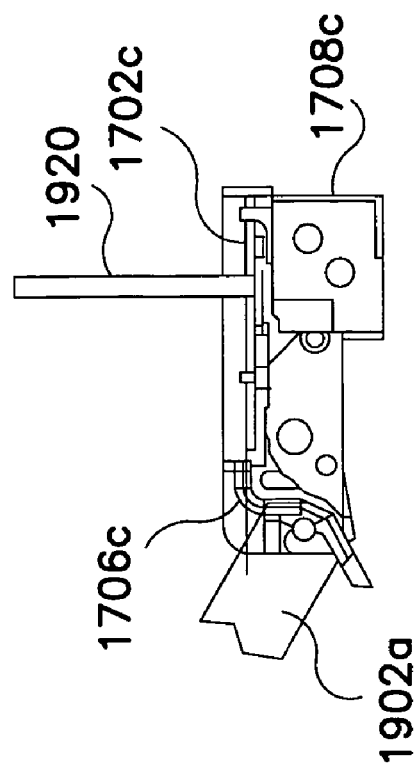
Figure 29:
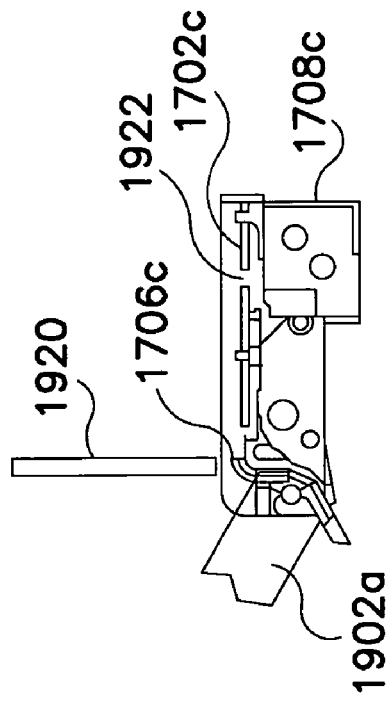
Figure 30:
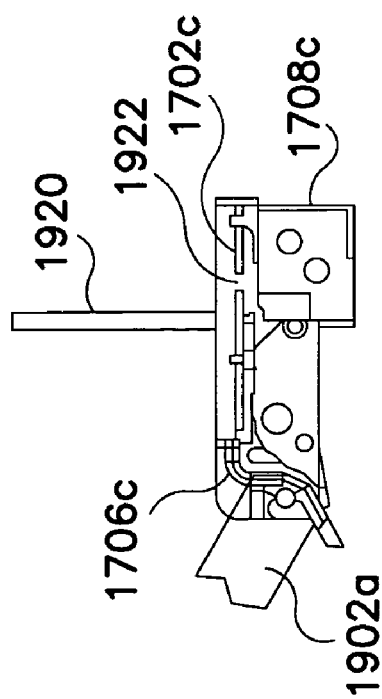
Figure 31:
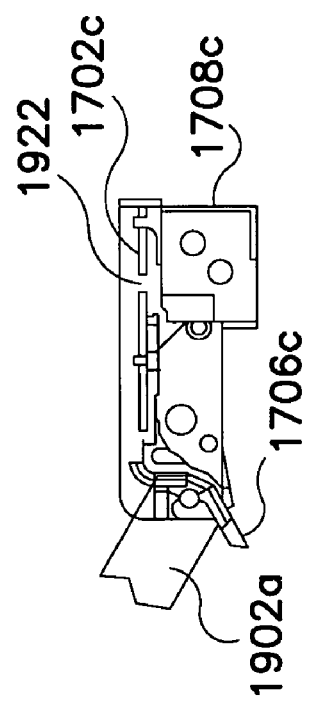

Referring first to FIGS. 27 and 28, first stages of the exemplary potting injection process are shown. The PCB 1702c may be placed in a cavity of the housing 1708c in the desired position. In the illustrated embodiment, the potting injection process may be carried out with a whale mouth tool 1902a engaged on the housing 1708c, thereby forming a weir on the housing 1708c in the region of the leads 1706c. An injection tube or nozzle 1920 may be inserted through a potting hole 1922 in the PCB 1702c and resin may be injected beneath the PCB 1702c. After the region of the housing 1708c beneath the PCB 1702c has been filled, the nozzle 1920 may be withdrawn from the potting hole 1922, and the top of the PCB 1702c may be filled, as shown in FIG. 29. The final injection step may include filling and dressing the region of the leads 1706c, as shown in FIG. 30. The presence of the whale mouth tool/weir 1902a may control or contain any overfill that may seep over or around the leads 1706c. After the housing 1708c has been completely filled with resin and dressed, as shown in FIG. 31, the resin may be cured. Advantageously, the resin may be a UV curable resin, although thermal, catalytic, etc. curable resins may also be used.

Figure 32:
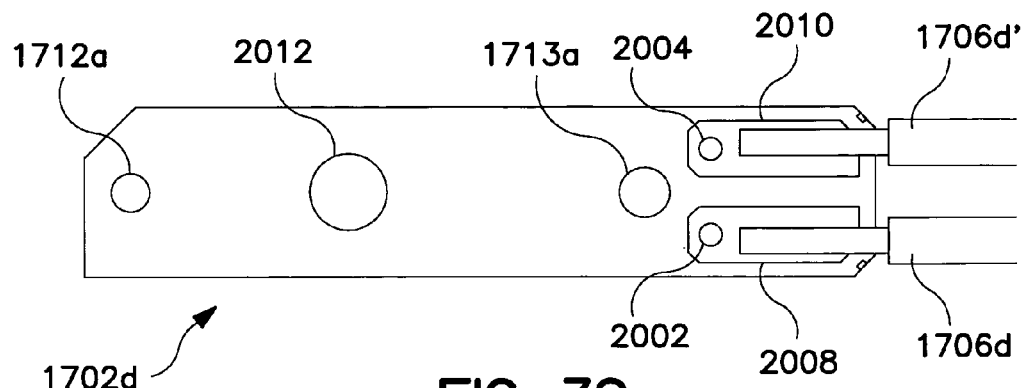
FIG. 32: shows a plan view of one exemplary PCB suitable for use with the sensor consistent with the present invention.

Referring next to FIG. 32, a plan view of an exemplary PCB 1702d is shown. The PCB 1702d may include solder joint inspection holes 2002, 2004. When a good solder joint is achieved between the leads 1706d, 1706d' and the respective solder pads 2008, 2010 the holes 2002, 2004 may also fill with solder. Accordingly, if the holes 2002, 2004 are filled with solder it may be likely that a good solder joint has been achieved.

The PCB 1702d may also include a potting hole 2012. The potting hole may allow the PCB 1702d to be potted into a housing (not shown). That is, as discussed above with respect to the exemplary potting injection process, the potting hole 2012 may allow potting resin to be injected into the housing or mold beneath the PCB 1702d, even after the PCB 1702d is dry assembled to the housing.

In regard to dry assembling the PCB 1702d to the housing, the PCB 1702d may include fitting holes 1712a, 1713a that may receive locating pins associated with a housing. This aspect is also shown in FIG. 18.

Figure 33:
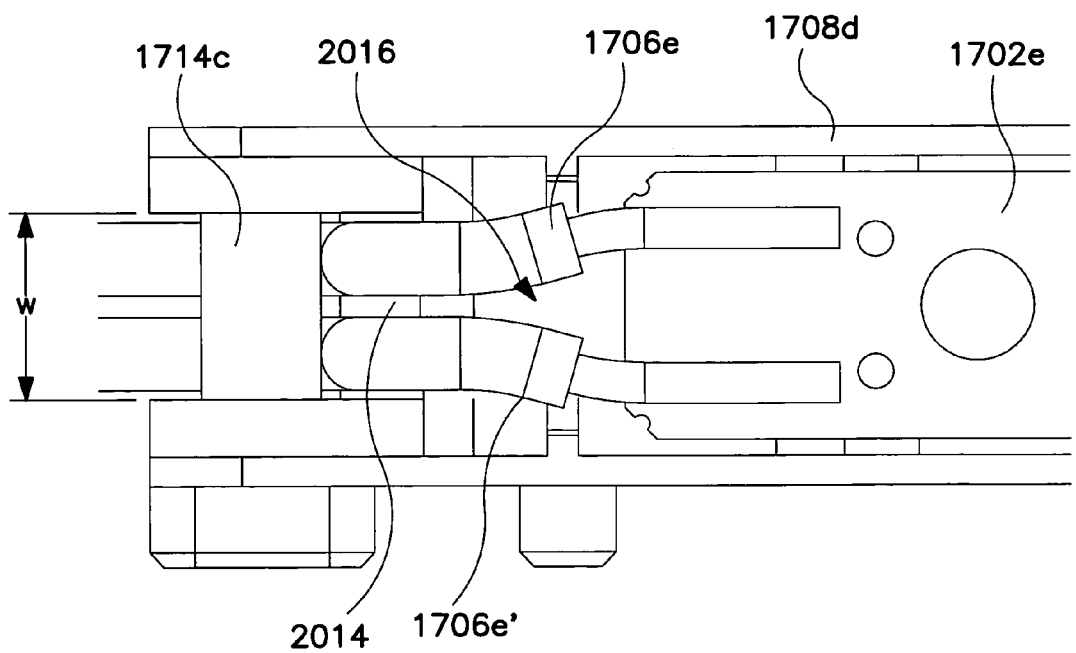
FIG. 33: is a detailed view of an exemplary wiring configuration useful for a sensor assembly consistent with the present invention.

Referring next to FIG. 33, a detailed view of a PCB 1702e installed in a housing 1708d is shown with leads 1706e, 1706e' extending from the PCB 1702e. The leads 1706e, 1706e' may be dressed around a pin 1714c, in the previously discussed labyrinth strain relief configuration. As shown, the width of the housing, w, may be provided generally equal to the width of the leads 1706e, 1706e', which may be dressed around a divider 2014. The dressed leads 1706e, 1706e' may define a pocket 2016 at the end of the PCB 1702e bounded at the rear by the leads 1706e, 1706e'. The pocket 2016 may contain the flow of potting resin. Accordingly, the housing 1708d may be formed without a rear wall.

Consistent with one exemplary embodiment, the Hall device may be a programmable Hall Effect switch, such as an Allegro A1184. The use of a programmable Hall device may allow the switching zone to be tailored to the dynamic magnetic field of the buckle. Tailoring the switching zone of the Hall device in this manner may allow the switching zone to be narrowed and the margin of safety, or cushion, to be more equal on both sides of the switching zone. Those having skill in the art will appreciate that a non-programmable Hall device may also suitably be employed herein.

Figure 34:
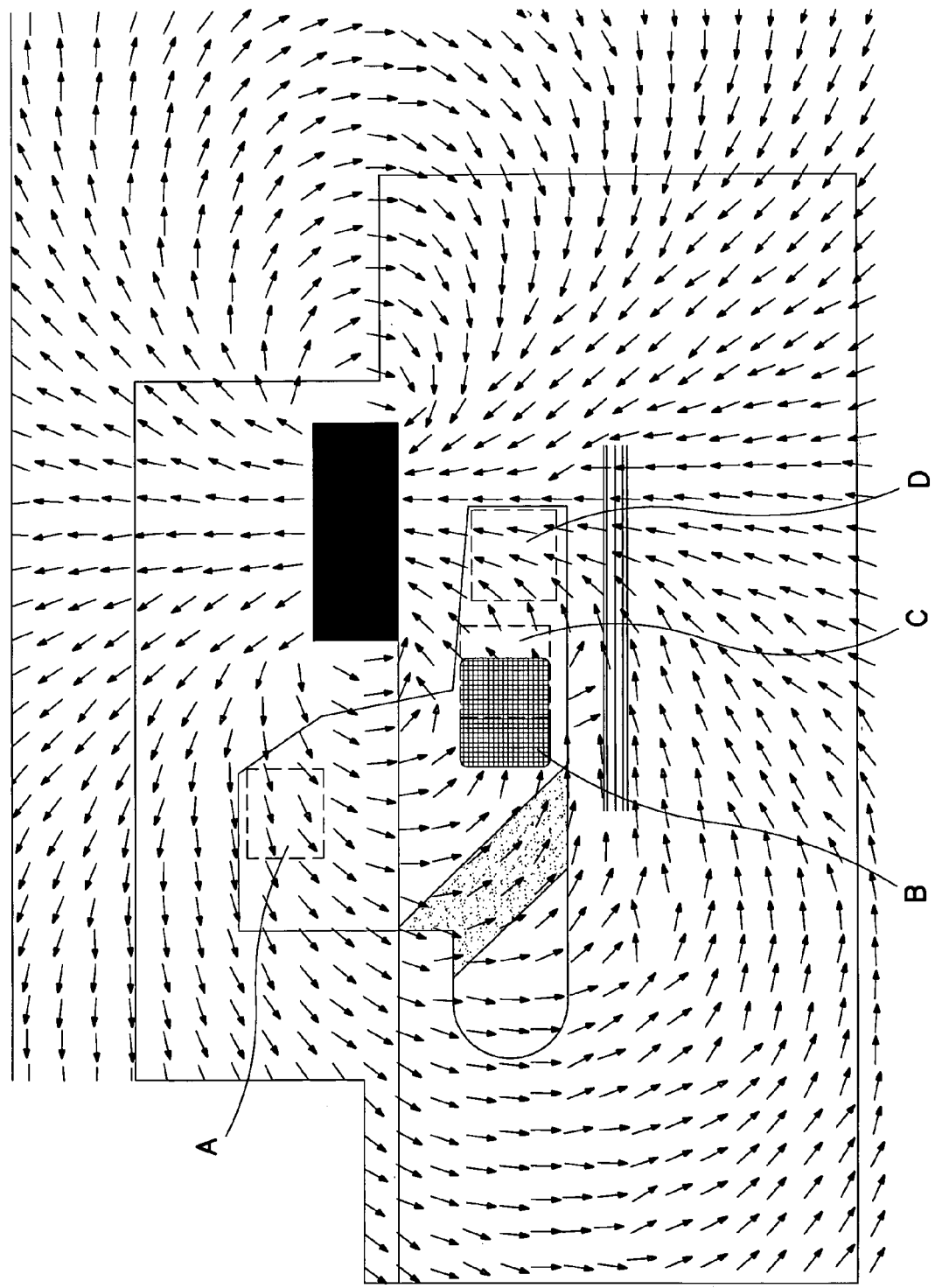
FIG. 34: diagrammatically illustrates a lock pin in four positions of travel relative to a sensor assembly consistent with the invention.

FIG. 34 is a schematic diagram of an exemplary buckle showing the lock pin in four positions of travel, and the associated position of the magnet disposed on the end of the lock pin relative to the Hall device. In position A, the lock pin may be in a nominal unlocked condition. When the lock pin is in position A, a buckle tongue may be released from the buckle. In position A the magnet may be disposed away from the Hall device, producing a first output of the Hall device. In position B the lock pin may be in a virtually unlocked condition. That is, the lock pin is partially locked, however, even though the lock pin is engaged, it may be possible for the buckle tongue to be released from the buckle under sufficient stress. Position C of the lock pin may be a locked limit position. The locked limit position C may be a first position in which a buckle tongue received in the buckle is restrained against release even under an applied stress. Position D of the lock pin may be a nominal locked position, or a fully locked position, wherein a buckle tongue may be secured in the buckle. The Hall device may be configured to provide a second output in the nominal locked position D, or in both the locked limit position C as well as in the nominal locked position D. The magnetic field plot shown in FIG. 34 may correspond to a field produced by the magnet in the virtually unlocked position B.

Figure 35:
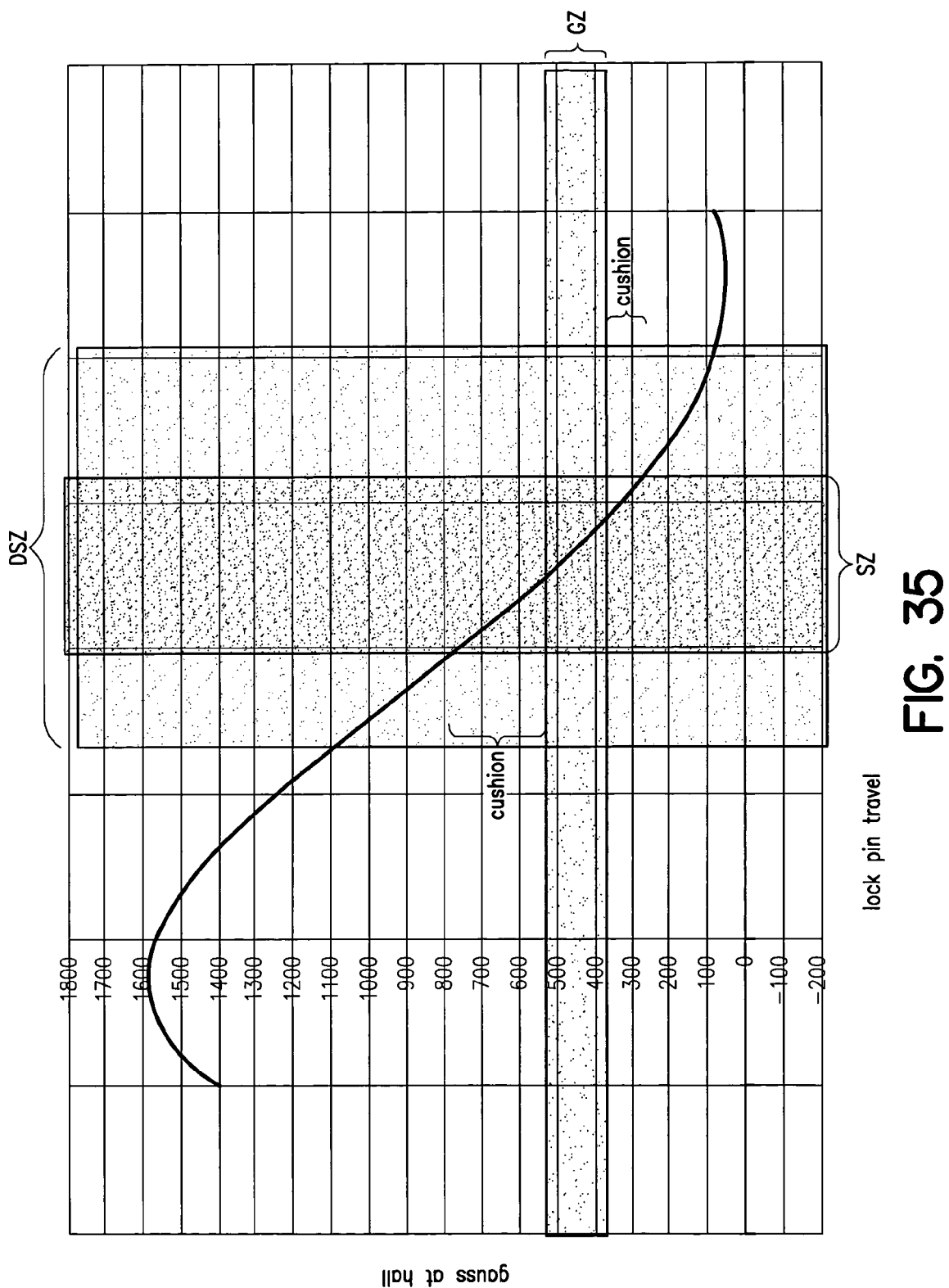
FIG. 35: is a plot of magnetic flux versus lock pin travel associated with a sensor assembly consistent with the invention.

Turning to FIG. 35, an exemplary plot of magnetic flux at a Hall device relative to lock pin travel is shown. Consistent with FIG. 35, magnetic flux through the Hall device may be a function of lock pin travel measured along an axis parallel to the Hall device. As shown in FIG. 34, lock pin position may be measured as lock pin travel along an axis parallel to the Hall device. Accordingly, lock pin position may be determined based on magnetic flux through the Hall device, giving rise to the first and second outputs of the Hall device. It should be understood that the lock pin may also have a movement component along an axis perpendicular to the Hall device. The movement of the lock pin may be varied according to design preference.

Those having skill in the art may appreciate that a Hall device may have a "gray zone", designated GZ in FIG. 35. In the exemplary Hall device of FIG. 35, the change gray zone extends between about 380 gauss and 520 gauss. A belt buckle having a lock pin, consistent with the present invention, may have a switch zone, designated SZ in FIG. 35, that is a region of travel during which the lock pin transitions from a locked condition to an unlocked condition, and vice versa. Referring to FIG. 34, the switch zone SZ may be the lock pin travel, along an axis parallel to the Hall device, between a locked and unlocked condition, e.g., between either a nominal unlocked position B and a locked limit position C, between a nominal unlocked position B and a nominal locked position D. The switch zone SZ may include the virtually unlocked position of the lock pin. The switch zone SZ, in terms of lock pin travel, may be varied depending upon various design considerations of the buckle. Similarly, the use of either the locked limit position C or the nominal locked position D as the locked value in defining the switch zone SZ is a design choice that may be varied consistent with the present invention.

Consistent with the present invention, a Hall device may be programmed or selected such that the gray zone GZ of the Hall device lies at least partially within the switch zone SZ of the lock pin travel. That is, the buckle design and the Hall device may be coordinated or configured so that the magnetic flux at the Hall device may be outside of the gray zone GZ at one or both limits of the switch zone SZ. For example, in the exemplary embodiment represented by FIG. 35 the Hall device gray zone GZ is entirely included within the switch zone SZ. In FIG. 35, the lock pin travel defining the left hand limit of the switch zone SZ imparts a flux to the Hall device that is above the upper limit of the exemplary Hall device gray zone GZ. Similarly, the lock pin travel defining the right hand limit of the switch zone SZ imparts a flux to the Hall device that is below the lower limit of the Hall device gray zone GZ. The amount by which the flux imparted on the Hall device at the limits of the switch zone SZ lies outside the respective limits of the gray zone GZ may be referred to as a cushion. The cushion may affect the amount of variation, error, etc. that may be present without affecting the accuracy of the sensor in indicating the condition of the lock pin.

Starting with the lock pin in a first condition, e.g., a locked condition, the Hall device may provide a first output indicative to the first lock pin condition. As the lock pin travels through the switch zone SZ the magnetic flux imparted to the Hall device may be within the Hall device gray zone GZ. By time the lock pin exits the switch zone SZ, i.e., completes the transition to a second, unlocked condition, the magnetic flux imparted to the Hall device is outside of the Hall device gray zone GZ, and the Hall device provides a second output indicating the second lock pin condition. If the Hall device gray zone GZ extends outside of the switch zone SZ, i.e., there is no cushion, there may be a portion of the lock pin travel in which the lock pin is in either a locked or unlocked condition, however because the gray zone extends out side of the switch zone SZ the Hall device may provide an output that is representative of an incorrect lock pin condition.

In the graph of FIG. 35, the buckle may be provided with a design or target switch zone, designated DSZ. An actual buckle may be provided having an actual switch zone SZ that is narrower than the design switch zone DSZ. In this case, if the gray zone GZ of the Hall device is fully encompassed by the switch zone SZ, the sensor may provide a larger upper and lower safety cushion, as discussed above. With respect to the design switch zone DSZ, when the lock pin is at either end of the design switch zone DSZ the magnetic flux at the Hall device may be even further above or below the gray zone GZ of the Hall device, as compared to the actual switch zone SZ. The amount that the magnetic flux at the Hall device is above or below the gray zone GZ is an additional safety cushion. The safety cushion may allow for manufacturing tolerances, wear in the buckle and/or lock pin with use, etc.

There is thus provided a seat buckle sensor assembly that reliably provides an output representative of the lock condition of a seat belt buckle. The sensor may include a variety of advantageous features, as described above. The embodiments that have been described herein, however, are but some of the several which utilize this invention and are set forth here by way of illustration but not of limitation. Additionally, it will be appreciated that aspects of the various embodiments may be combined in other embodiments. It is obvious that many other embodiments, which will be readily apparent to those skilled in the art, may be made without departing materially from the spirit and scope of the invention as defined in the appended claims.

What is claimed is:

1. A seat buckle sensor assembly comprising:
    a sensor housing;
    a single sensor at least partially disposed in said sensor housing; and
    said sensor housing being configured for attachment to a seat buckle housing of a seat buckle, said seat buckle comprising a lock pin having a magnet disposed on an end thereof, said lock pin movable through a switch zone extending between a first position of said lock pin wherein said lock pin achieves a locked condition and a second position of said lock pin wherein said lock pin achieves an unlocked condition;
    said sensor exhibiting a gray zone range of magnetic flux whereby flux imparted to said sensor beyond a first end of said gray zone range of magnetic flux causes said sensor to provide a first output and flux imparted to said sensor beyond a second end of said gray zone range of magnetic flux causes said sensor to provide a second output different from said first output, said gray zone range of magnetic flux being within a switch zone range of magnetic flux imparted by said magnet to said sensor as said lock pin travels through said switch zone, whereby said first output is provided as said lock pin travels through said switch zone before said lock pin achieves said locked condition and said second output is provided by said sensor as said lock pin travels through said switch zone before said lock pin achieves said unlocked condition.

2. A sensor assembly according to claim 1, wherein said sensor housing comprises a stepped top surface.

3. A sensor assembly according to claim 2, wherein said sensor assembly comprises a rubber sheet disposed in said sensor housing maintaining said sensor in a predetermined position within said sensor housing.

4. A sensor assembly according to claim 1, said assembly further comprising a shield, said shield comprising a shield housing and a cover, said shield housing comprising an opening adapted to receive a portion of said lock pin therethrough.

5. A sensor assembly according to claim 1, wherein said sensor comprises a Hall Effect sensor.

6. A sensor assembly according to claim 1, wherein said sensor is encapsulated within said sensor housing.

7. A sensor assembly according to claim 6, wherein an exterior of said sensor housing comprises at least one crush rib.

8. The assembly according to claim 1, said assembly further comprising a shield coupled to said sensor housing for blocking magnetic flux.

9. The assembly according to claim 8, wherein said shield comprises an opening positioned for receiving said lock pin.

10. The assembly according to claim 1, said assembly further comprising at least one electrical conductor extending from said sensor housing for coupling an output of said sensor to a location outside of said sensor housing, said electrical conductor being formed in an s-shape around at least a portion of said sensor housing.

11. The assembly according to claim 10, wherein said portion of said housing comprises a pin extending through at least a portion of said housing.

12. A seat buckle assembly comprising:
    a seat buckle configured to releasably retain a seat belt buckle tongue, said seat buckle comprising a seat buckle housing and a lock pin at least partially disposed in said seat buckle housing, said lock pin movable through a switch zone, said switch zone extending between a first position of said lock pin wherein said lock pin achieves a locked condition and a second position of said lock pin wherein said lock pin achieves an unlocked condition;
    a magnet disposed on an end of said lock pin;
    a sensor housing coupled to said seat buckle housing; and
    a single sensor at least partially disposed in said sensor housing, said sensor exhibiting a gray zone range of magnetic flux whereby flux imparted to said sensor beyond a first end of said gray zone range of magnetic flux causes said sensor to provide a first output and flux imparted to said sensor beyond a second end of said gray zone range of magnetic flux causes said sensor to provide a second output, different from said first output, said gray zone range of magnetic flux being within a switch zone range of magnetic flux imparted by said magnet to said sensor as said lock pin travels through said switch zone, whereby said first output is provided as said lock pin travels through said switch zone before said look pin achieves said locked condition and said second output is provided by said sensor as said look pin travels through said switch zone before said lock pin achieves said unlocked condition.

13. An assembly according to claim 12, further comprising a shield that comprises a shield housing and a cover, and wherein said sensor housing is at least partially disposed within said shield housing.

14. An assembly according to claim 13, further comprising a fastener extending through said shield cover, said sensor housing and said shield housing, said fastener engaged with said buckle.

15. The assembly according to claim 12, wherein said sensor further comprises a shield coupled to said sensor housing for blocking magnetic flux.

16. The assembly according to claim 15, wherein said shield comprises an opening, and wherein said lock pin extends through said opening.

17. The assembly according to claim 12, said assembly further comprising at least one electrical conductor extending from said sensor housing for coupling an output of said sensor to a location outside of said sensor housing, said electrical conductor being formed in an s-shape around at least a portion of said sensor housing.

18. A method of determining a state of a seat buckle comprising:
providing a seat buckle comprising a look pin, said lock pin movable through a switch zone, said switch zone extending between a first position of said lock pin wherein said lock pin achieves a locked condition and a second position of said lock pin wherein said look pin achieves an unlocked condition;
providing a seat buckle sensor assembly comprising a sensor; and
providing a magnet disposed on an end of said lock pin; said sensor exhibiting gray zone range of magnetic flux whereby flux imparted to said sensor beyond a first end of said gray zone range of magnetic flux causes said sensor to provide a first output and flux imparted to said sensor beyond a second end of said gray zone range of magnetic flux causes said sensor to provide a second output different from said first output, said gray zone range of magnetic flux being within a switch zone range of magnetic flux imparted by said magnet to said sensor as said lock pin travels through said switch zone, whereby said first output is provided as said lock pin travels through said switch zone before said lock pin achieves said locked condition and said second output is provided by said sensor as said lock pin travels through said switch zone before said lock pin achieves said unlocked condition.

19. The method according to claim 18, wherein said sensor comprises a Hall Effect sensor.

* * * * *

UNITED STATES PATENT AND TRADEMARK OFFICE
CERTIFICATE OF CORRECTION

| | | |
|---|---|---|
| PATENT NO. | : 7,119,671 B2 | Page 1 of 1 |
| APPLICATION NO. | : 10/761129 | |
| DATED | : October 10, 2006 | |
| INVENTOR(S) | : Frank et al. | |

It is certified that error appears in the above-identified patent and that said Letters Patent is hereby corrected as shown below:

Col. 10
Claim 12, line 27: After "said" delete "look" and insert --lock--.

Col. 11
Claim 18, line 3: After "a" delete "look" and insert --lock--.

Col. 11
Claim 18, line 7: After "said" delete "look" and insert --lock--.

Signed and Sealed this

Ninth Day of January, 2007

JON W. DUDAS
*Director of the United States Patent and Trademark Office*